United States Patent
Velikov et al.

(10) Patent No.: US 6,224,319 B1
(45) Date of Patent: May 1, 2001

(54) MATERIAL HANDLING DEVICE WITH OVERCENTER ARMS AND METHOD FOR USE THEREOF

(75) Inventors: Plamen Velikov, San Jose; James A. Cameron, Los Altos, both of CA (US)

(73) Assignee: Equibe Technologies, Mountain View, CA (US)

( * ) Notice: Subject to any disclaimer, the term of this patent is extended or adjusted under 35 U.S.C. 154(b) by 0 days.

(21) Appl. No.: 09/113,784

(22) Filed: Jul. 10, 1998

(51) Int. Cl.$^7$ .................................................... B66C 23/00
(52) U.S. Cl. ................................... 414/744.5; 414/744.6; 414/800
(58) Field of Search ................................ 414/744.5, 744.6, 414/744.1, 749.1, 800; 901/15, 21; 74/490.04

(56) References Cited

U.S. PATENT DOCUMENTS

| | | |
|---|---|---|
| 4,909,701 | 3/1990 | Hardegen et al. . |
| 5,147,175 * | 9/1992 | Tada .................................. 414/744.5 |
| 5,180,276 | 1/1993 | Hendrickson . |
| 5,186,718 | 2/1993 | Tepman et al. . |
| 5,431,529 | 7/1995 | Eastman et al. . |
| 5,569,014 | 10/1996 | Hofmeister . |
| 5,577,879 | 11/1996 | Eastman et al. . |
| 5,583,408 | 12/1996 | Lowrance . |
| 5,647,724 | 7/1997 | Davis et al. ......................... 414/937 |
| 5,676,472 | 10/1997 | Solomon et al. . |
| 5,682,795 | 11/1997 | Solomon et al. ..................... 403/387 |
| 5,720,590 | 2/1998 | Hofmeister . |
| 5,725,352 * | 3/1998 | Tanaka ............................... 414/744.5 |
| 5,743,704 * | 4/1998 | Caveney et al. .................... 414/744.5 |
| 5,857,826 * | 1/1999 | Sato et al. ........................... 414/744.6 |
| 5,971,701 * | 10/1999 | Kawamura et al. ................. 414/800 |

FOREIGN PATENT DOCUMENTS

87/07078 * 11/1987 (WO) ..................................... 901/21

* cited by examiner

*Primary Examiner*—Robert P. Olszewski
*Assistant Examiner*—Bryan Jaketic
(74) *Attorney, Agent, or Firm*—Weingarten, Schurgin, Gagnebin & Hayes LLP (57) ABSTRACT

A material handling device comprising first and second upper arm members having respective proximal and distal end portions and first and second forearm members having respective proximal and distal end portions. The proximal end portions of the first and second forearm members are pivotally coupled to the distal end portions of the respective first and second upper arm members by respective first and second pivot assemblies. The distal end portions of the first and second forearm members are attached together. A material handler is carried by the distal end portions of the first and second forearm members. The first and second forearm members have a retracted position in which the first and second forearm members extend linearly along an imaginary line passing through the first and second pivot assemblies with the distal end portions of the first and second forearm members being disposed approximately midway between the first and second pivot assemblies. A motor assembly is coupled to the first and second upper arm members for moving the distal end portions of the first and second forearm members in a first direction along a second imaginary line extending perpendicularly of the first imaginary line to a first extended position and in an opposite second direction along the second imaginary line to a second extended position. The distal end portions of the first and second forearm members pass through the retracted position when traveling from the first extended position to the second extended position.

21 Claims, 7 Drawing Sheets

MATERIAL HANDLING DEVICE WITH OVERCENTER ARMS AND METHOD FOR USE THEREOF

BRIEF DESCRIPTION OF THE INVENTION

This invention relates to material handling devices and more particularly to material handling devices for use in processing electronic devices, such as silicon wafers, liquid crystal displays, flat panel displays, disk drives, and the like.

BACKGROUND OF THE INVENTION

Robots have heretofore been provided for handling electronic devices during the manufacture and testing of electronic devices. See in this regard U.S. Pat. Nos. 5,186,718, 5,577,879 and 5,682,795. Some of these currently available robots utilize a frog-leg arm arrangement for moving a platform or hand between retracted and extended positions. See for example U.S. Pat. Nos. 4,909,701, 5,180,276, 5,647, 724, 5,569,014 and 5,720,590. These frog-leg arm arrangements, however, are relatively complex, space inefficient, and heavy. There is, therefore, a need for a new and improved robot which overcomes these disadvantages.

SUMMARY OF THE INVENTION

The apparatus of the invention includes a material handling device comprising first and second upper arm members having respective proximal and distal end portions and first and second forearm members having respective proximal and distal end portions. First pivot means pivotally couples the proximal end portion of the first forearm member to the distal end portion of the first upper arm member and second pivot means pivotally couples the proximal end portion of the second forearm member to the distal end portion of the second upper arm member. Attachment means secures the distal end portions of the first and second forearm members together. A material handler is carried by the distal end portions of the first and second forearm members. The first and second forearm members have a retracted position in which the first and second forearm members extend linearly along an imaginary line passing through the first and second pivot means with the distal end portions of the first and second forearm members being disposed approximately midway between the first and second pivot means. A motor assembly is coupled to the proximal end portions of the first and second upper arm members for moving the distal end portions of the first and second forearm members in a first direction along a second imaginary line extending perpendicularly of the first imaginary line to a first extended position and in an opposite second direction along the second imaginary line to a second extended position. The distal end portions of the first and second forearm members pass through the retracted position when traveling from the first extended position to the second extended position.

The invention provides a material handling device in which a material handling platform can move forwardly and backwardly over the center of the device between two extended positions. The material handling device of the invention is relatively space efficient since the over center position reduces the device footprint. The material handling device includes a platform that moves along a straight line between two extended positions. Advantageously, the device of the invention is suitable for use in a clean room environment.

DETAILED DESCRIPTION OF THE INVENTION

Reference will now be made in detail to the preferred embodiment-of the invention which is illustrated in the accompanying figure. The description of the embodiments of the invention will be followed by a discussion of their operation.

Figure 1:
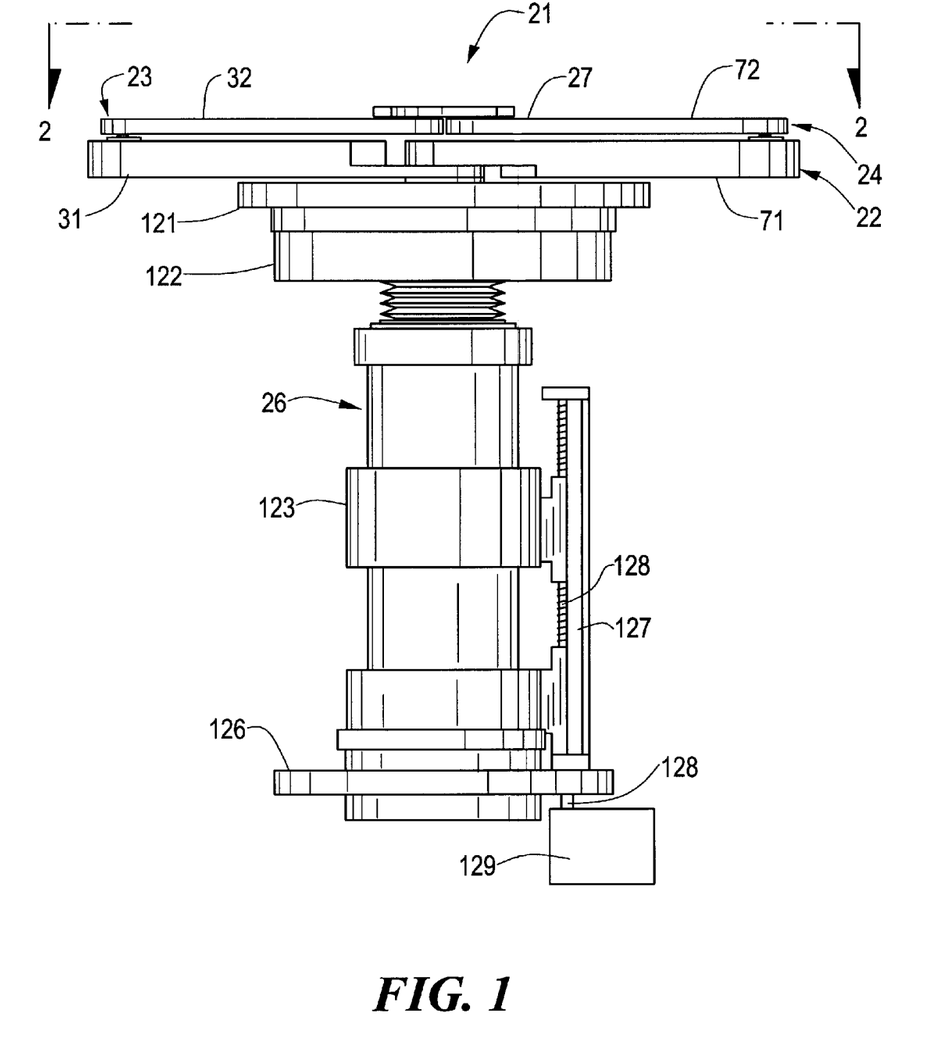
FIG. 1 is a front elevational view of the material handling device with overcenter arms of the present invention.

Material handling device or robot 21 includes an arm assembly 22 having a first or left arm 23 and second or right arm 24 (see FIG. 1). A motor means or assembly 26 is attached to the first or proximal end of each arm 23 and 24. An end effector 27, preferably a dual paddle end effector having first and second opposite material handlers or paddles 28 and 29, is attached to the second or distal ends of left and right arms 23 and 24. Robot 21 is particularly suited for intrabay handling of silicon wafers in a semiconductor manufacturing process.

First or left arm 23 includes an upper arm member or upper link 31 and a forearm member or inner link 32 (see FIGS. 1–4). Each of the elongate links 31 and 32 has a straight line configuration and is made from any suitable material such as aluminum. Upper link 31 has a first or proximal end portion in the form of circular flange 31a and a second or distal end portion 31b. Link 31 is provided with a recess 33 which opens to the underside thereof and is formed in part by a top wall 34. Forearm link 32 has a first or proximal end portion 32a and a second or distal end portion 32b. The forearm link 32 is formed in part by first and second opposite side walls 36 and 37 which are joined by a rounded end wall 38 at distal end portion 32b. A cylindrical hub 39 extends upwardly from distal end portion 32b. Upper link 31 is longer than forearm link 32.

Figure 3:
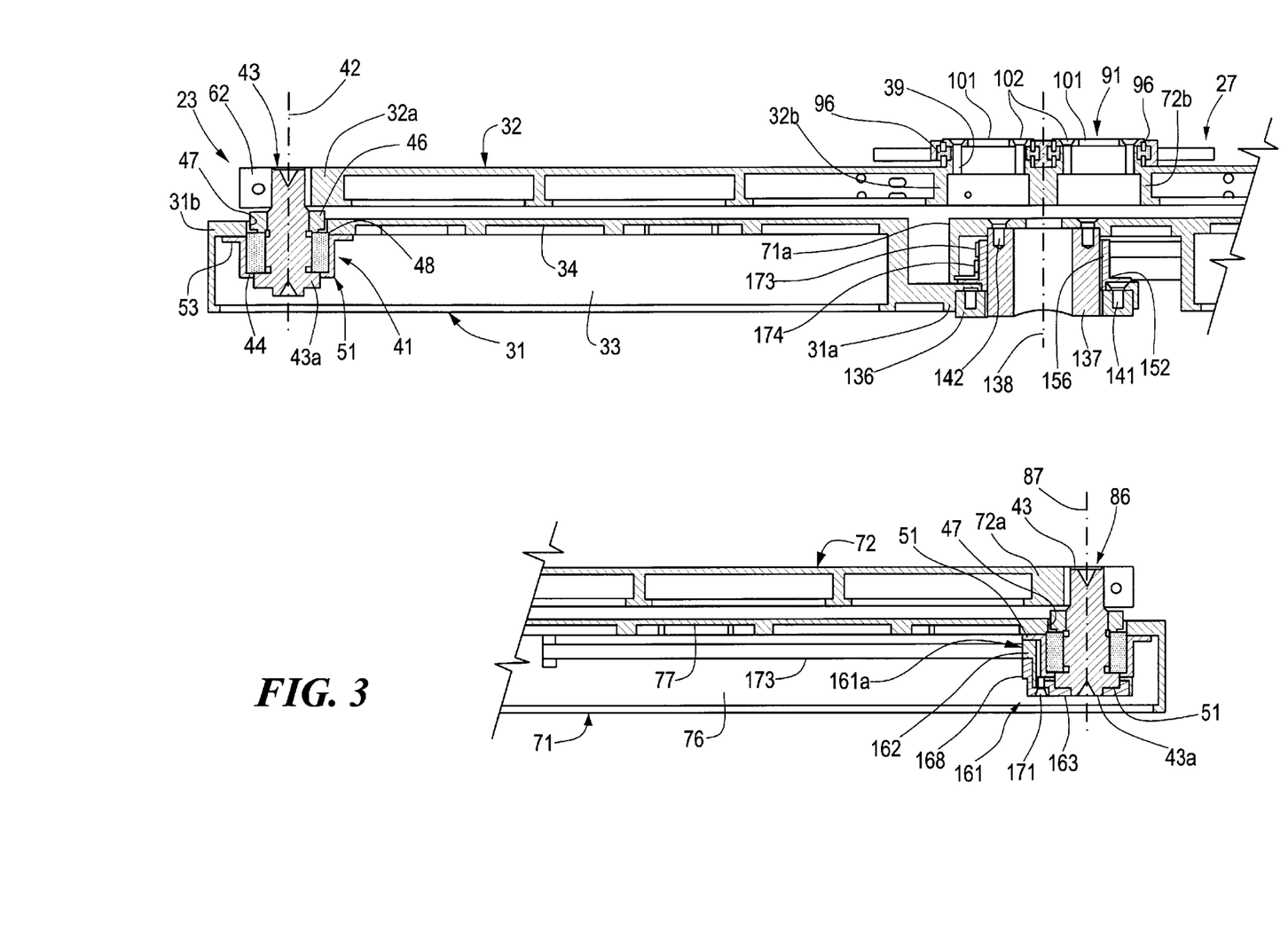
FIG. 3 is a cross-sectional view of the material handling device with overcenter arms of FIG. 1 taken along the line 3—3 of FIG. 2.
Figure 4:
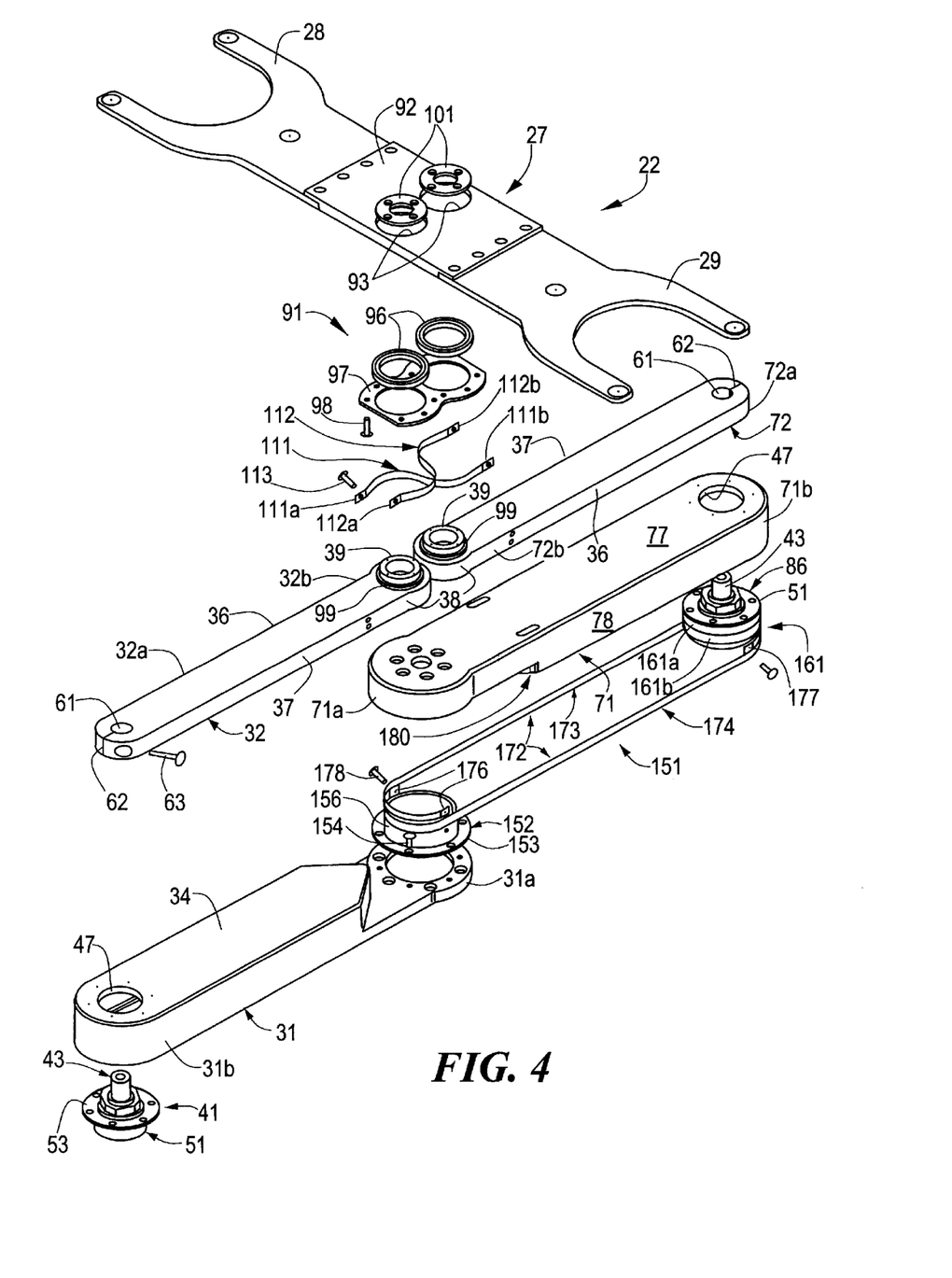
FIG. 4 is an exploded view of the arm assembly of the material handling device with overcenter arms of FIG. 1.

First or left-pivot means or assembly 41 is included within arm assembly 23 to couple distal end portion 31b of the left upper link 31 to proximal end portion 32a of the left forearm link 32 for pivoting about a left pivot axis 42 (see FIGS. 3 and 4). In this regard, a cylindrical shaft 43 made from stainless steel or any other suitable material and having an enlarged lower end 43a is provided. A circular contact bearing 44 is concentrically mounted about shaft 43 and rests against lower end 43a. A nut 46 is threadably mounted on shaft 43 for urging the inner face of contact bearing 44 against lower end 43a and thus securing the contact bearing to the shaft 43. The shaft 43 extends through a circular opening 47 provided in top wall 34 at distal end portion 31b. An annular shoulder 48 is formed in wall 34 at opening 47 for seating the outer face of contact bearing 44. A hollow cylindrical housing 51 encircles the lower portion of contact bearing 44 for urging its outer face against annular shoulder 48. The housing 51 is secured to upper link 32 within recess 33 by a plurality of fasteners or screws 52 extending through top wall 34 around opening 47 and threadably engaging a circular flange 53 formed in the top of bearing housing 51. The proximal end portion 32a of the left forearm link 32 is provided with a bore 61 which extends between the parallel top and bottom surfaces of the proximal end portion 32a for seating the cylindrical top end portion of shaft 43. A slit 62 extends through the end of distal end portion 32b to bore 61. Fastener or screw 63 is threadably received within a bore provided in the distal end portion 32b which extends across slit 62. Tightening of screw 63 serves to clamp shaft 43 within bore 61.

Right arm 24 includes an upper arm member or upper link 71 and a forearm member or forearm link 72 (see FIGS. 1–4). The right elongate links 71 and 72 are each straight line in configuration and made from aluminum or any other suitable material. Right upper link 71 has a first or proximal end portion 71a and a second or distal end portion 71b. The right upper link 71 is provided with a recess 76 which opens to the underside of the link 71 and is formed in part by a planar top wall 77 and first and second side walls 78. Right upper link 71 has other parts and characteristics similar to left upper link 31 and, as such, like reference numerals have been used to describe such like parts and characteristics of links 31 and 71.

Right forearm link 72 has a first or proximal end portion 72a and a second or distal end portion 72b. The right forearm link 72 has parts and characteristics similar to left forearm link 32 and, as such, like reference numerals have been used to describe such like parts and characteristics of links 32 and 72. Right upper link 72 is longer than right forearm link 72.

Second or right pivot means or assembly 86, shown most clearly in FIGS. 3 and 4, is included within arm assembly 22 to couple distal end portion 71b of right upper link 71 to proximal end portion 72a of right forearm link 72 for pivoting about a right pivot axis 87. The right pivot assembly 86 is substantially identical to left pivot assembly 41 and like reference numerals have been used to describe like parts of left and right pivot assemblies 41 and 86.

Figure 2:
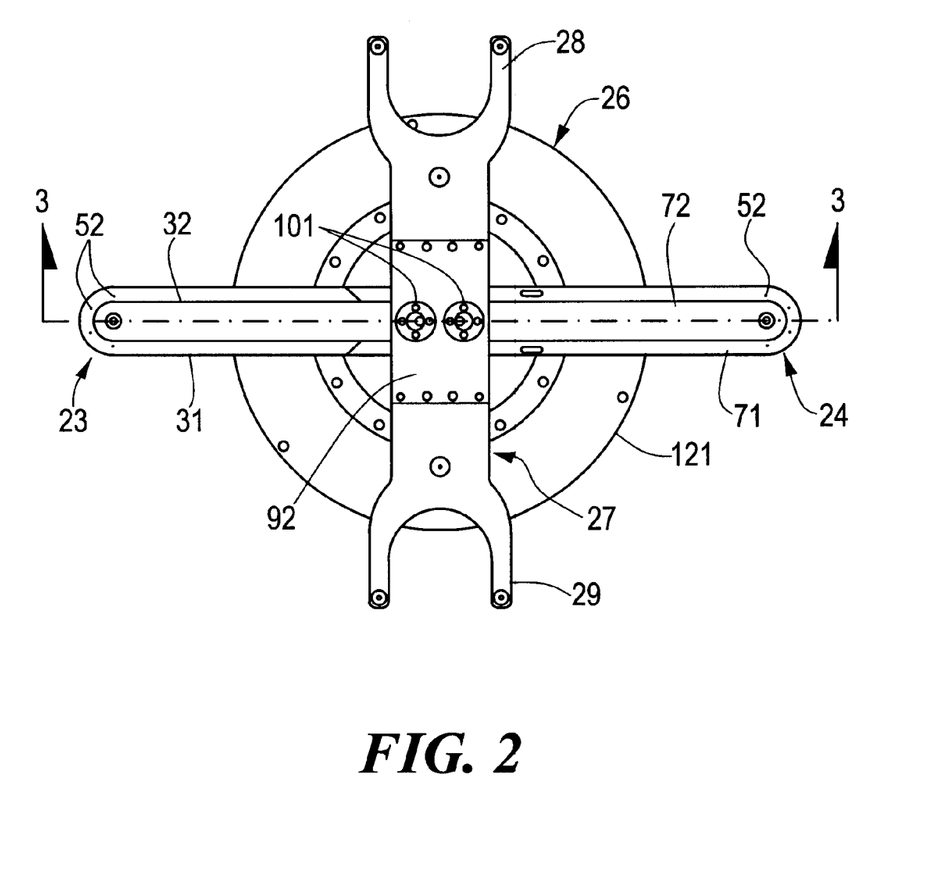
FIG. 2 is a top plan view of the material handling device with overcenter arms of FIG. 1 taken along the line 2—2 of FIG. 1.

End effector plate 92 is included within the attachment means or assembly 91 of arm assembly 22 for pivotally securing together distal end portions 32b and 72b of left and right forearm links 32 and 72 (see FIGS. 2–4). End effector 27 has a central plate portion 92 adjoining first and second platforms or paddles 28 and 29. The central plate portion 92 is provided with first and second spaced-apart circular openings 93 centered on a line extending perpendicularly of the longitudinal axis of the end effector. First and second circular bearings 96 are mounted to the bottom of plate portion 92 by means of an 8-shaped clamp 97. A plurality of fasteners or screws 98, one of which is shown in FIG. 4, extend through the clamp 97 and threadably engage the underside of plate portion 92. The outer faces of bearings 96 are held firmly against plate portion 92 by clamp 97. The inner faces of first and second bearings 96 are each concentrically mounted about each of the hubs 39 provided on the distal end portions 32b and 72b of forearm links 32 and 72.

Each of the hubs 39 is provided with an annular shoulder 99 against which the respective inner face seats. The inner face of each of first and second bearings 96 is retained about respective hub 39 against annular shoulder 99 by a circular disk or clamp 101 which rests atop the inner face. A plurality of fasteners or screws 102 serve to secure each clamp 101 to the respective hub 39. Each circular clamp 101 at least partially seats within the respective opening 93 in plate portion 92 but is diametrically sized so as to not engage the plate portion 92. In this manner, each of the bearings 96 permits the respective hub 39 to pivot relative to the end effector plate 92.

Attachment assembly 91 further includes first and second S-bands 111 and 112 made from stainless steel or any other suitable material (see FIG. 4). First S-band 111 has a first extremity or end portion 111a and a second extremity or end portion 111b. First end portion 111a is secured to first side wall 36 of left forearm link 32 behind end wall 38 by any suitable means such as a fastener or screw 113. The S-band 111 extends around at least a portion of rounded end wall 38 of the left forearm link 32 before crossing over to the rounded end wall 38 of right forearm link 72. Second end portion 111b is secured to first side wall 36 of the right forearm link 72 at a point behind the rounded end wall 38 by another screw 113 (not shown). Second S-band 112 has first and second extremities or end portions 112a and 112b. First end portion 112a of the second S-band 112 is secured by a screw 113(not shown) to second side wall 37 of left forearm link 32 behind rounded end wall 38 of the left link 32. The S-band extends at least partially around the rounded end wall 38 before crossing over to and extending around at least a portion of the rounded end wall 38 of right forearm link 72. Second end portion 112b is secured to second side wall 37 of the right forearm link 72 behind the rounded end wall 38 by a screw 113 (not shown).

Motor assembly 26 is provided in robot 21 for driving left and right arms 23 and 24 and thus end effector 27. The motor assembly 26 can be of any conventional type. For example, the invention has been implemented with a two axes vacuum megatorque motor having a Systems Product Name M-U157 manufactured by NSK, Ltd located in Japan. As shown generally in FIG. 1, motor assembly 26 includes a top flange 121 and a top support flange 122 provided atop a cylindrical housing 123. A ring-shaped base 126 is concentrically disposed about housing 123 for mounting motor assembly 26 to any suitable support structure (not shown). A conventional monocarrier support 127 serves to secure the housing 123 to the base 126 in a manner which permits the housing 123 to be elevationally adjusted relative to base 126. In this regard, support 127 includes an elongate screw 128 connected to and driven by a conventional motor 129 for moving the housing 123 upwardly and downwardly relative to base 126. As a result, arms 23 and 24 are adjusted in a vertical or Z-axis direction.

Motor assembly 26 is further provided with first and second tubular output shafts 136 and 137 which extend upwardly and outwardly from the horizontally-disposed top flange 121 (see FIG. 3). Shafts 136 and 137 extend along a central vertical axis 138 of motor assembly 26, first output shaft 136 being coaxially disposed about second output shaft 137. Motor assembly 26 has a first motor (not shown) for driving first output shaft 136 in first and second opposite rotational directions about a vertical axis 138 and a second motor (not shown) for driving second output shaft 137 in such first and second opposite rotational directions. Circular flange 31a of left upper link 31 is mounted to the top of first output shaft 136 so that the upper link extends perpendicularly of the output shaft 136. A plurality of fasteners or screws 141 extend downwardly through respective bores provided in circular flange 31*a* and threadably secure within axially-extending bores provided in first output shaft 136. Proximal end portion 71*a* of right upper link 71 is secured to the top end of second output shaft 137 in a similar manner by a plurality of screws 142. Right upper link 71 thus extends perpendicularly of the second output shaft 137.

A pulley and belt assembly 151 is included within the drive mechanism of robot 21. As shown most clearly in FIGS. 3 and 4, a first pulley 152 is rigidly mounted to circular flange 31*a*. The pulley 152 has a flange portion 153 which rests atop the circular flange 31*a* and is secured thereto by any suitable means such as fasteners or screws 154, one of which is shown in FIG. 4. A cylindrical wall 156 axially centered on vertical axis 138 extends upwardly from flange 153 of the first pulley.

A second pulley 161 is non-rotatably mounted to shaft 43 of right pivot assembly 86 and is formed from a first or upper pulley portion 161*a* and a second or lower pulley portion 161*b*. Upper pulley portion 161*a* includes a cylindrical wall 162 disposed around bearing housing 51. A flange 163 extends radially inwardly from the bottom of cylindrical wall 162 and seats within an annular recess 164 provided on enlarged lower end 43*a* of shaft 43. Lower pulley portion 161*b* includes a cylindrical wall 168 and a flange 169 extending radially inwardly from wall 168. The lower pulley portion 161*b* nests around the outside of cylindrical wall 162 and flange 163 of upper pulley portion 161*a*. Pulley portions 161*a* and 161*b* are rigidly mounted to lower end 43*a* of shaft 43 by any suitable means such as a plurality of fasteners or screws 171 which extend upwardly through the portions 161*a* and 161*b* to threadably engage bearing housing 51. Cylindrical walls 162 and 168 have respective outer cylindrical surfaces, each circular in cross-section, which together form the outer cylindrical surface of second pulley 161. As so mounted to lower end 43*a*, of shaft 43, second pulley 161 rotates with the shaft 43 and around bearing housing 51.

A belt means or assembly 172 has a first extremity mounted on first pulley 152 and a second extremity mounted on second pulley 161 to cause second or slave pulley 161 to rotate about second pivot axis 87 when first or master pulley 152 rotates about vertical axis 138. Belt assembly 172 has first and second band-like members or bands 173 and 174 each having a first or proximal end portion 176 and a second or distal end portion 177. First and second bands 173 and 174 are each made from a suitable material such as stainless steel.

The proximal end portions 176 of the first and second bands 173 and 174 are secured to cylindrical wall 156 in diametrically opposed positions by any suitable means such as screws 178, one of which is shown in FIG. 4. Bands 173 and 174 are counter-mounted about pulley 152. In this regard, first band 163 bends around approximately one-half of cylindrical wall 156 before extending to second pulley 161. Second band 174 bends around approximately one-half of cylindrical wall 156 in a counter-clockwise direction to first band 173 before similarly extending to the second pulley. An opening 180 is provided in each of the side walls 78 for permitting the extension of first and second bands 173 and 174 between the first and second pulleys 152 and 161. First band 173 is disposed vertically above second band 174 on cylindrical wall 156.

Distal end portions 177 of the first and second bands 173 and 174 are mounted to second pulley 161 in a similar manner. Specifically, first band 173 bends around the far side of upper pulley portion 161*a* in a clockwise direction and second band 174 bends around the far side of lower pulley portion 161*b* in a counter-clockwise direction. Distal end portions 177 of the first and second bands 173 and 174 are secured to respective pulley portions 161*a* and 161*b* by any suitable means such as screw 178. The bifurcation of second pulley 161 into upper and lower pulley portions 161*a* and 161*b* permits the pulley portions 161*a* and 161*b* to be independently rotated about shaft 43 before the pulley portions are rigidly mounted to the shaft so as to tighten first and second bands 173 and 174. Although belt assembly 172 is shown as consisting of first and second bands 173 and 174, it should be appreciated that a single belt formed from an endless loop member can be provided to rotatably couple second pulley 161 to first pulley 152 and be within the scope of the present invention.

Figure 5:
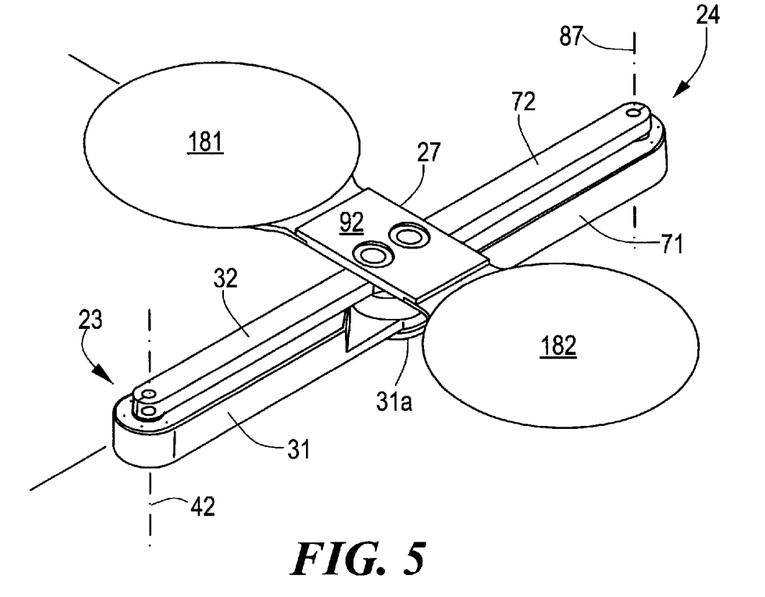
FIG. 5 is a perspective view of the arm assembly of FIG. 4 in a home position.

In operation and use, robot 21 can be used for picking up and handling silicon wafers, such as first and second wafers 181 and 182, in a semiconductor manufacturing bay. End effector 27 is movable in the operation of robot 21 from a retracted or home position shown in FIG. 5, to a first extended position shown in FIG. 6 and to a second extended position shown in FIG. 7. In the home position of FIG. 5, left and right forearm links 32 and 72 extend linearly along an imaginary line 183 extending between vertical pivot axes 42 and 87 of left and right pivot assemblies 41 and 86. As shown in FIG. 5, distal end portions 32*b* and 72*b* of the left and right forearm links and end effector 27 carried thereby are disposed approximately midway between pivot axes 42 and 87 when arm assembly 22 is in its home position. Left and right upper links 31 and 71 also extend linearly along first imaginary line 183 when arm assembly 22 is in its home position. Rotation by motor assembly 26 of first output shaft 136 in a clockwise direction about vertical axis 138 and rotation of second output shaft in an opposite counter-clockwise direction about the axis 138 causes left and right upper links 31 and 72 to pivot toward each other about vertical axis 138 in a scissor-like motion. Such pivoting of the upper links 31 and 71 causes proximal portions 32*a* and 72*a* of left and right forearm links 32 and 72 to likewise pivot in a scissor-like motion relative to end effector 27. This resulting movement of arm assembly 22 causes distal end portions 32*b* and 72*b* of the left and right forearm links 32 and 72 to move in a first direction along a second imaginary line 184 extending perpendicularly of first imaginary line 183 and intersecting line 183 midway between pivot axes 42 and 87 (see FIG. 6).

Figure 6:
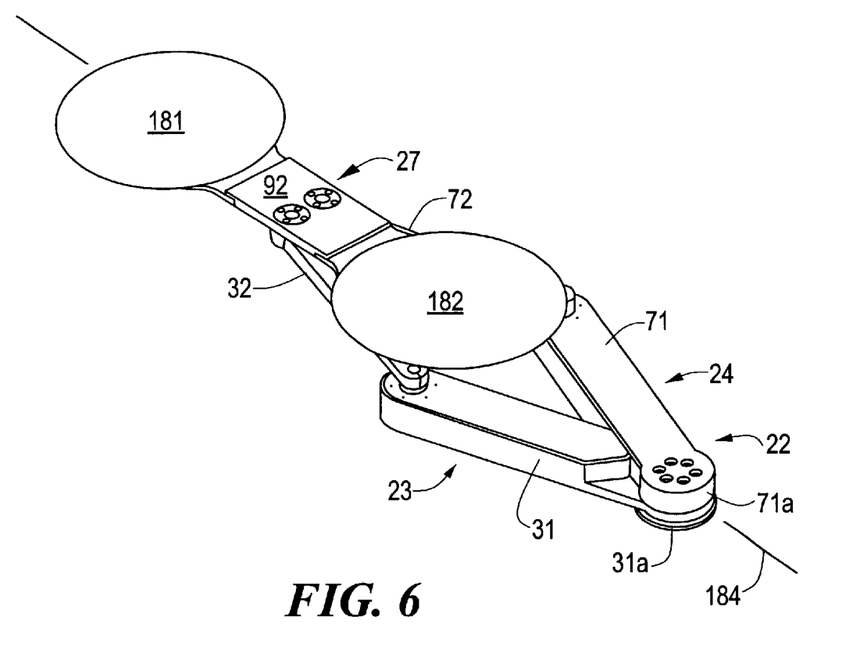
FIG. 6 is a perspective view of the arm assembly of FIG. 4 in a first extended position.
Figure 7:
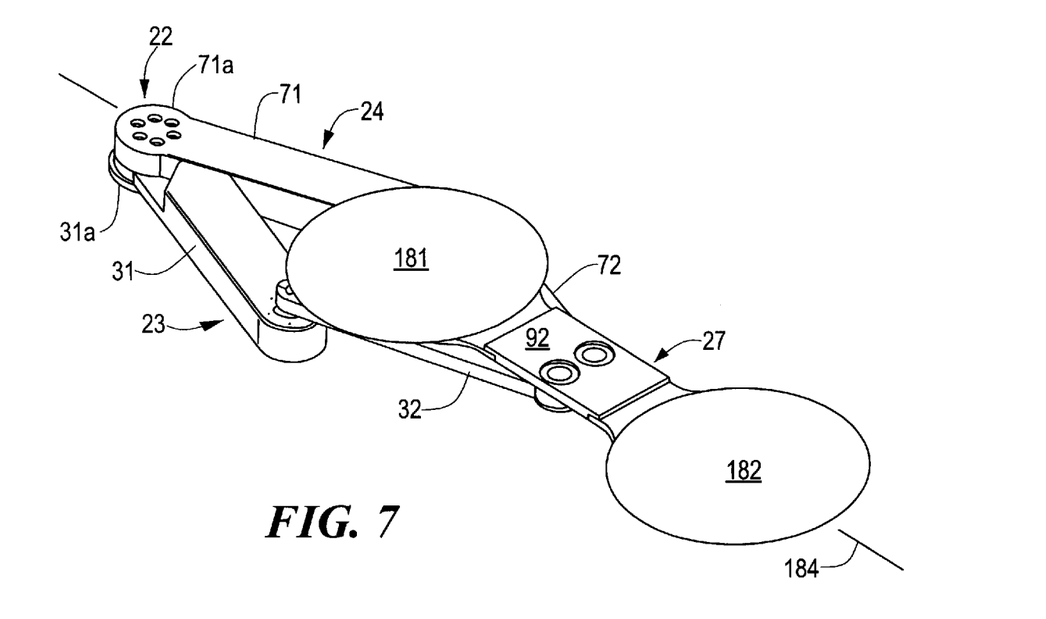
FIG. 7 is a perspective view of the arm assembly of FIG. 4 in a second extended position.

Rotation by motor assembly 26 of first output shaft 136 in a counter-clockwise direction about vertical axis 138 and rotation of second output shaft 137 in an opposite clockwise direction about the vertical axis 138 causes distal end portions 32*b* and 72*b* and end effector 27 carried thereby to move from the first extended position, shown in FIG. 6, back to the home position, shown in FIG. 5, to a second extended position shown in FIG. 7. As discussed below, when in the home position, as shown in FIG. 5, the handled material is typically rotated before another extended position is assumed. The second extended position shown in FIG. 7 is on the opposite side of first imaginary line 183 from the first extended position shown in FIG. 6. The distal end portions 32*b* and 72*b* move in a second direction along second imaginary line 184 when moving from the first extended position of FIG. 6 to the second extended position of FIG. 7. It should be appreciated that the end effector 27 may be randomly positioned at any location between the extended positions along the second imaginary line 184. Observe that the second direction is opposite the first direction in which distal end portions 32b and 72b move along second imaginary line 184 when traveling from the retracted position of FIG. 5 to the first extended position of FIG. 6.

Pulley and belt assembly 151 transmit the necessary drive from motor assembly 26 to move arm assembly 22 past the point of singularity, that is the overcenter position in which left and right upper links 31 and 71 and left and right forearm links 32 and 72 extend linearly between pivot axes 42 and 87. In general, belt assembly 172 transmits drive from first output shaft 136 to shaft 43 of right pivot assembly 86 and thus proximal end portion 72a so as to pivot the right forearm link 72 about right pivot axis 87 past the point of singularity. More specifically, rotation of first pulley 152 in a clockwise direction causes second band 174 to be placed in tension and thus cause second pulley 161 to similarly rotate in a clockwise direction about right pivot axis 87. Conversely, rotation of first pulley 152 in a counter-clockwise direction about vertical axis 138 causes first band 173 to be placed in tension and thus cause second pulley 161 to similarly rotate in a counter-clockwise direction about axis 87.

Rotation of first and second pulleys 152 and 161 in a clockwise direction causes distal end portion 72b of right forearm link 72 to pivot in a clockwise direction about right pivot axis 87. Rotation of the pulleys 152 and 161 in a counter-clockwise direction causes distal end portion 72b to pivot in a counter-clockwise direction about the axis 87. The pivoting of right forearm link 72 causes left forearm link 32 to similarly pivot about left pivot axis 42. The motive forces of pulley and belt assembly 151 are ancillary to the primary drive provided by left and right upper links 31 and 71 to left and right forearm links 32 and 72 except when the upper links 31 and 71 and forearm links 32 and 72 pass over center, that is over first and right output shafts 136 and 137.

First and second crossed S-bands 111 and 112 retain distal end portions 32b and 72b of left and right forearm links 32 and 72 in a fixed relative relationship during movement of the distal end portions along second imaginary line 184. The S-bands 111 and 112 permit the distal end portions 32b and 72b to rotate with first and second bearings 96 relative to each other but require the pivot axes of the bearings 96 to remain centered along an imaginary line extending parallel to first imaginary line 183.

Robot 21 permits end effector 27 to be rotated about vertical axis 138 and elevated relative to base 126. The end effector 27 and arm assembly 22 can be rotated clockwise about vertical axis 138 by motor assembly 26 rotating both first and second output shafts 136 and 137 in unison in a clockwise direction about axis 138. Rotation of first and second output shafts 136 and 137 in unison in a counter-clockwise direction about vertical axis 138 similarly causes the end effector 27 and arm assembly 22 to be rotated in a counter-clockwise direction about the axis 138. Motor 129 serves to drive screw 128 and thus move end effector 27 upwardly and downwardly relative to base 126.

In an exemplary use of robot 21, first paddle 28 on end effector 27 is moved from its retracted position shown in FIG. 5 to an extended position shown in FIG. 6 and then lifted to grasp a first wafer 181 for transport. The end effector 27 is then moved back to its retracted position and rotated relative to vertical axis 138. First wafer 181 is placed in a second location by extension of end effector 27 to its first extended position and lowering of first paddle 28 by means of motor 129. After retraction of end effector 27 to its home position, second paddle 29 of the end effector is rotated about vertical axis 138 and then moved to its extended position, shown in FIG. 7, for grasping second wafer 182. In a manner similar to that discussed above with respect to first paddle 28, second paddle 29 is retracted, rotated and extended again for placement of second wafer 182 in its destination within the bay of operation. Thereafter, first wafer 182 is retrieved again by first paddle 28 for a subsequent process.

Figure 8:
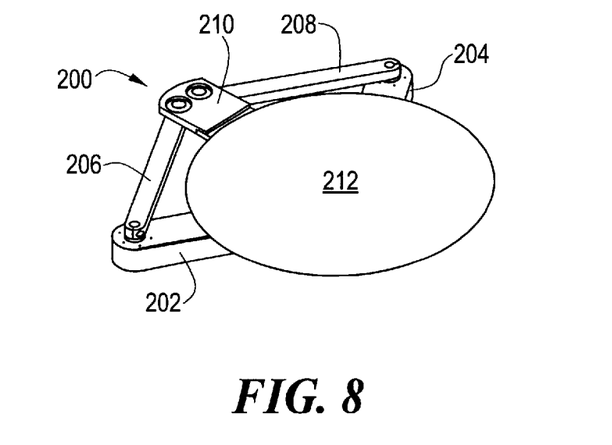
FIG. 8 is a perspective view of an alternate arm assembly in a home position.
Figure 9:
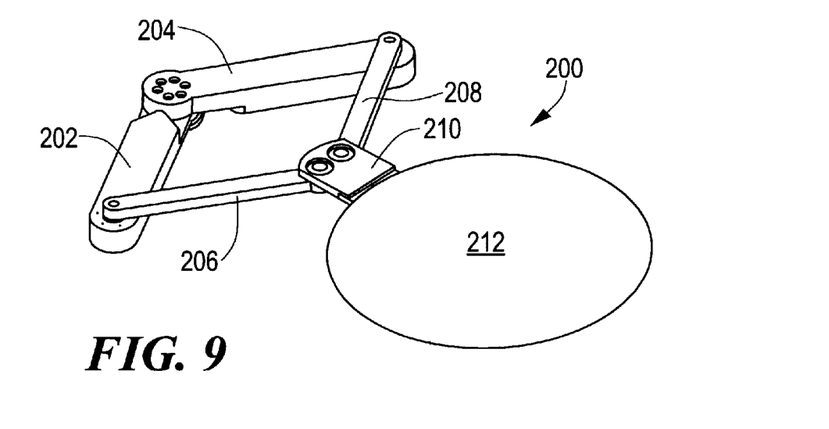
FIG. 9 is a perspective view of the arm assembly of FIG. 8 in a partially extended position.
Figure 10:
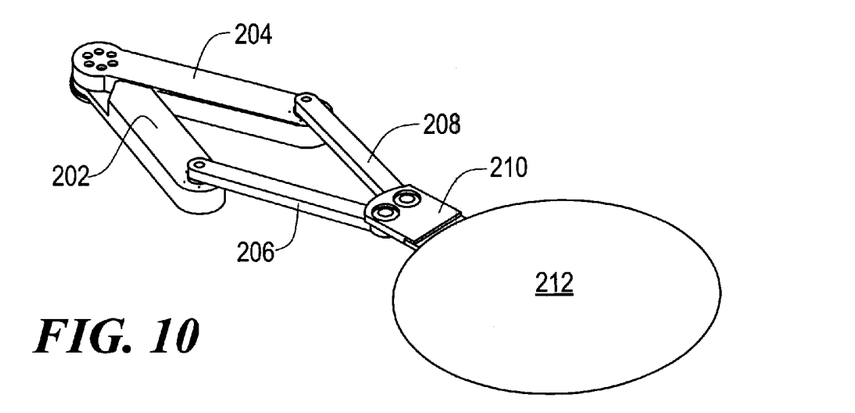
FIG. 10 is a perspective view of the arm assembly of FIG. 8 in a fully extended position.

FIG. 8 illustrates a material handling device or robot 200 in accordance with another embodiment of the invention. The robot 200 includes a left link 202, a right link 204, a left forearm 206 and a right forearm 208. The end effector 210 has a single material handling paddle to support a material 212. Those skilled in the art will appreciate that the embodiment of FIG. 8 has a relatively small "footprint". Observe that in the home position of FIG. 8, the material 212 is positioned over center and all portions of the end effector 210 are over center or relatively close to the over center position. Thus, the device 200 can be used in relatively confined work environments. FIG. 9 illustrates the device 200 in a partially extended configuration. FIG. 10 illustrates the device 200 in a fully extended configuration.

Figure 11:
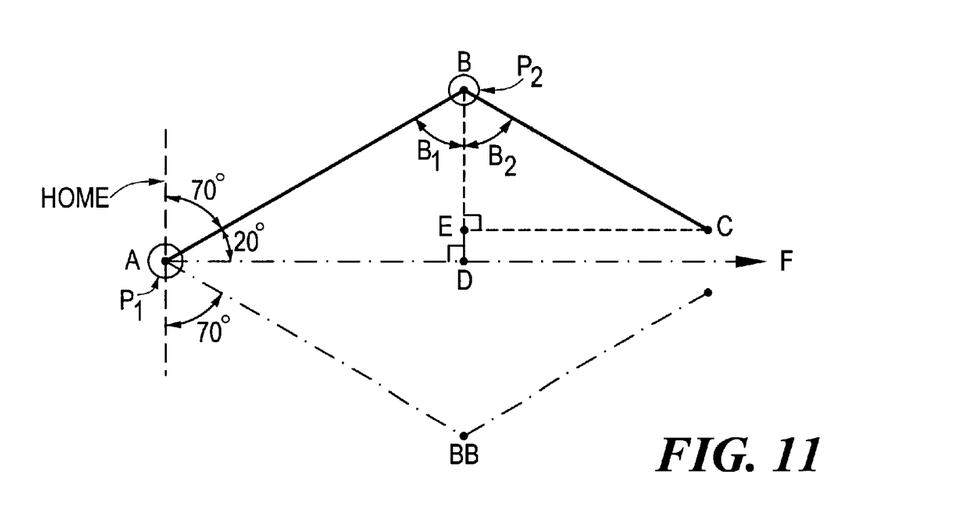
FIG. 11 is a simplified view of the arm assembly of the invention and the geometrical measurements used to size components of the arm assembly.

FIG. 11 is a simplified view of the arm assembly of the invention and the geometrical measurements used to size components of the arm assembly. Because the length of the base links is not equal to the length of the forearm links, the angular displacement for certain extensions is not equal. Because the center pulley is attached to the lower link and the planet pulley is attached to the forearm link, their angular displacements must match the angular displacements of the corresponding links. Thus, the pulleys' diameters must have predetermined ratios. The formula below is helpful in determining the diameters of the center and planet pulleys:

$$Te = (\cos A * AB) + (BC^2 - ((\sin A * AB) - (AB - BC))^2)^{sqrt} \quad \text{(Equation 1)}$$

where:

B1=90°-A

B2=sin EC/BC

B=B1+B2

AB=base link (71)

BC=forearm link (72)

BD=sin A*AB

AD=cos A*AB

BE=BD-(AB-BC)

EC=$(BC^2-BE^2)^{sqrt}$

Te (Total Extension)=AD+EC

P1=sun (center) pulley (152)

P2=planet pulley (161,161a;161b)

Assume that the base link (AB) is 10" (distance from center to center) and the forearm link (BC) is 9.27< (distance from center to center). If the arm is fully extended in the radial direction, the base link (AB) will move 70° clockwise from its home position, the opposing link (A/BB) will move 70° counterclockwise from its home position. Thus, the planet pulley (P2) will spin around the center pulley (P1) a total of 140°. Using equation 1, one can calculate that the total extension would be 18.268" and the angular displacement of the outer link (BC) and its respective planet pulley (P2) would be 143.129°. Thus, the ratio between the pulleys' diameters is 0.979. Hence, if the diameter of center pulley (P1) is 1.75", the planet pulley (P2) diameter must be 1.712".

As can be observed from the formula and sample above, since the links (AB/BC) are different lengths, the ratio between their angular displacements varies depending on the extension. The smaller the difference between their lengths, the lower the fluctuation of the ratio becomes. If they were equal, the ratio would be 1. Since in that particular design the difference between the links' lengths is only 0.73", the ratio varies between 0.979 to 0.980, which allows this slight difference to be absorbed by the elasticity of the bands. If a bigger arm and a longer extension are designed, elliptical planet pulleys must be used to compensate for a uniform angular displacement in order to obtain a perfectly straight line motion.

As can be seen, robot 21 permits considerable flexibility in the operation of first and second paddles 28 and 29. The symmetrical design of arm assembly facilitates true linear movement of end effector 27 along second imaginary line 184 for facilitating proper wafer processing. The simplified structure of arm assembly 22 requires only the four links 31, 32, 71 and 72. These rigid links are used for producing movement in end effector 27 at all locations except at the point of singularity shown in FIG. 5. The reduced weight of arm assembly 22 requires less input torque from first and second output shafts 136 and 137 and thus permits smaller motors to be utilized within motor assembly 26.

Although the material handling device of the present invention has been shown and described with concentrically disposed output shafts, it should be appreciated that the first and second output shafts can be spaced apart. In such an embodiment, the lengths of the first and second upper arm members or links are shorter relative to the first and second forearm members or forearm links than upper links 31 and 71 described above.

From the foregoing, it can be seen that a material handling device has been provided in which the material handling platform can move forwardly and backwardly over the center of the device between two extended positions. The arm assembly for moving the material handling platform is relatively lightweight. The material handling platform moves along a straight line between its two extended positions. The material handling device is suitable for use in a clean room environment.

What is claimed is:

1. A material handling device comprising:

first and second upper arm members having respective proximal and distal end portions, first and second forearm members having respective proximal and distal end portions, first pivot means pivotally coupling the proximal end portion of the first forearm member to the distal end portion of the first upper arm member and second pivot means pivotally coupling the proximal end portion of the second forearm member to the distal end portion of the second upper arm member, attachment means for securing the distal end portions of the first and second forearm members together, a material handler carried by the distal end portions of the first and second forearm members, the first and second forearm members having a retracted position in which the first and second forearm members extend linearly along an imaginary line passing through the first and second pivot means with the distal end portions of the first and second forearm members being disposed approximately midway between the first and second pivot means and a motor assembly including a first output shaft coaxially disposed about a second output shaft, said first and second output shafts extending perpendicularly from said first and second upper arm members, said first output shaft coupled to said proximal end portion of said first upper arm member and said proximal end portion of said second output shaft coupled to said second upper arm member for moving the distal end portions of the first and second forearm members in a first direction along a second imaginary line extending perpendicularly of the first imaginary line to a first extended position, in an opposite second direction along the second imaginary line to a second extended position whereby the distal end portions of the first and second forearm members pass through the retracted position when traveling from the first extended position to the second extended position and in a rotational direction about said output shafts.

2. A material handling device as in claim 1 wherein the first and second upper arm members have a length and the first and second forearm members have a length less than the length of the first and second upper arm members.

3. A material handling device as in claim 1 further comprising a band-like member having proximal and distal end portions and a first pulley coupled to the first output shaft and a second pulley coupled to the proximal end portion of the second forearm member, the proximal end portion of the band-like member mounted on the first pulley for rotation therewith and the distal end portion of the band-like member mounted on the second pulley for rotation therewith whereby rotation of the first output shaft in a first direction causes the distal end portion of the second forearm member to pivot in a first direction relative to the second upper arm member.

4. A material handing device as in claim 3 wherein the band-like member is a metal band.

5. A material handling device as in claim 3 further comprising an additional band-like member having proximal and distal end portions, the proximal end portion of the additional band-like member mounted on the first pulley for rotation therewith and the distal end portion of the additional band-like member mounted on the second pulley for rotation therewith whereby rotation of the first output shaft in a second direction causes the distal end portion of the second forearm member to pivot in a second direction relative to the second upper arm member.

6. The material handling device of claim 1 wherein the attachment means includes first and second crossed S-bands having respective first and second extremities, the first extremity of each of the first and second crossed S-bands secured to the distal end portion of the first forearm member and the second extremity of each of the first and second crossed S-bands secured to the distal end portion of the second forearm member whereby the first and second crossed S-bands retain said distal end portions in a fixed relative relationship during movement of said distal end portions.

7. The material handling device of claim 1 wherein said material handler comprises an end effector and at least one paddle.

8. The material handling device of claim 7 wherein the material handler comprises two paddles.

9. A wafer handling device comprising:

left and right upper arm members having proximal and distal end portions, left and right forearm members having respective proximal and distal end portions, first pivot means coupling the proximal end portion of the left forearm member to the distal end portion of the left upper arm member for pivoting about a first pivot axis and second pivot means coupling the proximal end portion of the right forearm member to the distal end portion of the right upper arm member for pivoting about a second pivot axis, attachment means for securing the distal end portions of the left and right forearm members together, a platform carried by the distal end portions of the left and right forearm members, a motor assembly having first and second output shafts respectively coupled to the proximal end portions of the left and right upper arm members, a first pulley secured to the first output shaft for rotation therewith, a second pulley secured to the proximal end portion of the right forearm member for rotation therewith and belt means having a first extremity mounted on the first pulley and a second extremity mounted on the second pulley whereby rotation of the first output shaft in a first rotational direction and rotation of the second output shaft in an opposite second rotational direction causes the distal end portions of the left and right forearm members to move in a first linear direction along a first imaginary line extending perpendicularly of a second imaginary line passing through the first and second pivot axes to a first extended position, rotation of the first output shaft in the second rotational direction and rotation of the second output shaft in the first rotational directions causes the distal end portions of the left and right forearm members to move in an opposite second linear direction along the first imaginary line to a second extended position and whereby the belt means moves the distal end portions of the left and right forearm members over the first and second output shafts when traveling from the first extended position to the second extended position, and rotation of said first and second output shafts in the same rotational direction causes the wafer handling device to rotate about said output shafts.

10. A wafer handling device as in claim 9 wherein the first output shaft is coaxially disposed about the second output shaft.

11. A wafer handling device as in claim 10 wherein the belt means is made from a metal material.

12. A wafer handling device as in claim 11 wherein the belt means includes first and second metal bands having respective proximal and distal end portions, said proximal end portions secured to the first pulley and said distal end portions secured to the second pulley.

13. The wafer handling device of claim 9 wherein the attachment means includes first and second crossed S-bands having respective first and second extremities, the first extremity of each of the first and second crossed S-bands secured to the distal end portion of the left forearm member and the second extremity of each of the first and second crossed S-bands secured to the distal end portion of the right forearm member whereby the first and second crossed S-bands retain said distal end portions in a fixed relative relationship during movement of said distal end portions.

14. The wafer handling device of claim 9 wherein said material handler comprises an end effector and at least one paddle.

15. The wafer handling device of claim 9 wherein the material handler comprises two paddles.

16. A method for using a material handling device having first and second upper arm members with respective proximal and distal end portions and first and second forearm members with respective proximal and distal end portions, the proximal end portions of the first and second forearm members being respectively coupled to the distal end portions of the first and second upper arm members for pivotal movement about respective first and second pivot axes, and a dual platform being carried by the distal end portions of the first and second forearm members, comprising the steps of moving the distal end portions of the first and second forearm members from a first extended position in a direction along a first imaginary line extending perpendicularly of a second imaginary line extending between the first and second pivot axes to a retracted position in which said distal end portions are disposed on the second imaginary line, rotating said material handling device about a coupling between said proximate end portions of said first and second upper arm members, and moving said distal end portions from the retracted position along the first imaginary line in the same direction to a second extended position opposite of the first extended position relative to the second imaginary.

17. A method as in claim 16 further comprising the step of moving said distal end portions from the second extended position along the first imaginary line in a direction opposite of the first-named direction to the first extended position.

18. A method as in claim 16 wherein a platform is carried by said distal end portions, further comprising the step of lifting said distal end portions upwardly so that the platform engages a silicon wafer.

19. The method of claim 16 further comprising the step of moving said distal end portions from the second extended position along the first imaginary line in a direct opposite of the first- named direction to the retracted position.

20. The method of claim 19 wherein said rotating step is performed after said third moving step.

21. The method of claim 20 further comprising the step of moving said distal end portions from the retracted position along the first imaginary line in a direct opposite of the first-named direction to the first extended position.

* * * * *

UNITED STATES PATENT AND TRADEMARK OFFICE
CERTIFICATE OF CORRECTION

PATENT NO.    : 6,224,319 B1  Page 1 of 1
DATED         : May 1, 2001
INVENTOR(S)   : Plamen Velikov et al.

It is certified that error appears in the above-identified patent and that said Letters Patent is hereby corrected as shown below:

<u>Title page,</u>
Item [73], Assignee, "Equibe" should read -- Equipe --;
Item [57], ABSTRACT,
Line 8, delete "first and";

<u>Column 2,</u>
Line 30, "embodiment-of" should read -- embodiment of --;
Line 49, "31 a" should read -- 31a --;

<u>Column 5,</u>
Line 56, "163" should read -- 173 --; and

<u>Column 8,</u>
Line 53, "9.27<" should read -- 9.27" --.

Signed and Sealed this

Twentieth Day of August, 2002

Attest:

*Attesting Officer*

JAMES E. ROGAN
*Director of the United States Patent and Trademark Office*